United States Patent
Saito

(10) Patent No.: US 9,258,884 B2
(45) Date of Patent: Feb. 9, 2016

(54) SUPPRESSION OF CURRENT COMPONENT USING EBG STRUCTURE

(71) Applicant: CANON KABUSHIKI KAISHA, Tokyo (JP)

(72) Inventor: Katsuo Saito, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 267 days.

(21) Appl. No.: 13/886,045

(22) Filed: May 2, 2013

(65) Prior Publication Data

US 2013/0307642 A1    Nov. 21, 2013

(30) Foreign Application Priority Data

May 17, 2012    (JP) ................................. 2012-113759

(51) Int. Cl.
| | | |
|---|---|---|
| *H01P 5/12* | (2006.01) | |
| *H05K 1/02* | (2006.01) | |
| *H01P 1/00* | (2006.01) | |
| *H01Q 15/00* | (2006.01) | |

(52) U.S. Cl.
CPC ................ *H05K 1/0236* (2013.01); *H01P 1/00* (2013.01); *H01Q 15/0086* (2013.01); *H01Q 15/0093* (2013.01)

(58) Field of Classification Search
CPC .... H05K 1/0236; H01P 1/00; H01Q 15/0086; H01Q 15/0993
USPC .......................................................... 333/12
See application file for complete search history.

(56) References Cited

U.S. PATENT DOCUMENTS

| | | |
|---|---|---|
| 5,321,502 A | 6/1994 | Matsumoto et al. |
| 5,362,684 A | 11/1994 | Saito et al. |
| 5,510,631 A | 4/1996 | Saito et al. |
| 6,289,036 B1 | 9/2001 | Saito et al. |
| 8,165,532 B2 | 4/2012 | Saito |
| 8,208,631 B2 | 6/2012 | Saito |
| 2013/0157586 A1 | 6/2013 | Saito |

FOREIGN PATENT DOCUMENTS

JP    2011-018776 A    1/2011

*Primary Examiner* — Robert Pascal
*Assistant Examiner* — Kimberly Glenn
(74) *Attorney, Agent, or Firm* — Fitzpatrick, Cella, Harper & Scinto

(57) ABSTRACT

A structure member is mounted in a communication apparatus including a conductive housing incorporating a dielectric substrate on which a high-frequency circuit is mounted. The structure member includes a pass member which passes a harmonic current component of an operating frequency generated in the dielectric substrate when the high-frequency circuit operates, and a suppression member having an EBG structure which suppresses a predetermined current component of the operating frequency. The structure member is provided between the dielectric substrate and the conductive housing. The suppression member is disposed along a current path of a harmonic current component flowing in the pass member.

28 Claims, 7 Drawing Sheets

SUPPRESSION OF CURRENT COMPONENT USING EBG STRUCTURE

BACKGROUND OF THE INVENTION

1. Field of the Invention

The present invention relates to an EBG (Electromagnetic Band Gap) structure which prevents the propagation of electromagnetic waves in a specific frequency band. More specifically, the present invention provides a member and an apparatus which reduce unnecessary radiation noise emitted from a wireless communication apparatus without decreasing the antenna radiation gain of the wireless communication apparatus by using an EBG structure member.

2. Description of the Related Art

Recently, studies have been made on an EBG technique for preventing the propagation of electromagnetic waves in a specific frequency band.

As a measure against unnecessary radiation without using any conventional EBG technique, there is available a technique of bonding a radio wave absorber that absorbs electromagnetic waves to an electrical component or transmission path which emits unnecessary electromagnetic waves in order not to emit the unnecessary electromagnetic waves outside an apparatus. If a high-frequency circuit portion of an apparatus is high-frequency coupled to a peripheral conductive member, the mechanical size of a member is resonant with a specific frequency. For this reason, in order to suppress the resonance, for example, high-frequency conduction is provided with respect to another conductive member, thereby suppressing resonance at a specific frequency.

A conventional technique of suppressing unnecessary radiation components emitted from an apparatus will be described with reference to FIGS. 9 and 10.

FIG. 9 is a perspective view schematically showing the internal structure of a wireless communication apparatus. Reference numeral 600 denotes a wireless communication apparatus; 601, a dielectric substrate housed in the wireless communication apparatus 600; 602, an antenna (antenna element or antenna pattern) mounted on the dielectric substrate 601; 603, a GND portion of the dielectric substrate 601; 604, a high-frequency unit (a module including an oscillator and an amplifier) for transmitting/receiving radio signals; 605, a conductive attachment plate for attaching/fixing the dielectric substrate 601; 606, a fixing screw; and 607, a conductive housing which is part of the constituent members of the wireless communication apparatus 600 and formed from, for example, a conductive cover.

Reference numeral 608 denotes a circle whose size represents, in a simulated manner, the intensity of radio waves emitted from the antenna 602. In addition, the lengths of the arrows in FIG. 9 indicate, in a simulated manner, the intensities of unnecessary radiation emitted from the dielectric substrate 601.

In the arrangement shown in FIG. 9, the unnecessary radiation components emitted from the wireless communication apparatus 600 exhibit large values, and the intensities of the radio waves emitted from the antenna 602 also have sufficient gains. Assume that the antenna gain is about −10 dBD.

FIG. 10 shows an arrangement obtained by providing a measure for reducing unnecessary radiation components for the arrangement in FIG. 9.

Note that reference numerals 700 to 708 denote the same members as those denoted by reference numerals 600 to 608 in FIG. 9, and hence a detailed description of them will be omitted.

In the arrangement different from that shown in FIG. 9, a conductive member 709 is disposed between the conductive attachment plate 705 and the conductive cover 707 to electrically connect the conductive attachment plate 705 to the conductive cover 707. Electrically connecting the conductive attachment plate 705 to the conductive cover 707 forms a current path along which the current components of electromagnetic waves contributing to unnecessary radiation excited by the GND portion 703 of the dielectric substrate 701 flow into the conductive cover 707 forming the wireless communication apparatus 707.

With this arrangement, the current components of electromagnetic waves contributing to the unnecessary radiation excited by the GND portion 703 partially flow into the conductive cover 707. If the current components of unnecessary radiation are harmonics of the operating fundamental frequency of the wireless communication apparatus 700 and become higher frequencies, they will be more consumed by flowing on the overall surface of the conductive cover 707. This reduces the amount of radiation from the wireless communication apparatus 700.

With the above arrangement, however, the intensity (antenna gain) of the radio waves emitted from the antenna 702 decreases to, for example, about −15 dBD.

When the antenna 702 is mounted on the dielectric substrate 701, the size of the GND portion 703 in the longitudinal direction can be about $\lambda/4$ with respect to a wavelength $\lambda$ at the operating center frequency. The antenna gain changes even if the wavelength is less than $\lambda/4$ or more than $\lambda/4$.

If the conductive attachment plate 705 and the conductive cover 707 are configured to be electrically connected to each other to reduce unnecessary radiation, the GND portion 703 of the dielectric substrate 701 is high-frequency coupled to the conductive cover 707 when viewed from the antenna 702. This makes it impossible to ensure optimal mounting conditions for the antenna 702.

There is available a technique of suppressing electromagnetic waves generated from a high-frequency circuit by using an EBG structure member so as to prevent the electromagnetic waves generated from the high-frequency circuit housed in the apparatus from influencing other apparatuses.

For example, there is available a technique of suppressing currents contributing to unnecessary radiation by disposing an EBG structure member in the current path of unnecessary radiation components excited on the wall surface of a conductive material housed in the internal space of the electromagnetic waves generated from the high-frequency circuit housed in the apparatus (Japanese Patent Laid-Open No. 2011-18776).

According to Japanese Patent Laid-Open No. 2011-18776, the unnecessary radiation components of unspecified frequencies emitted from the overall conductive housing are suppressed by checking the current path of electromagnetic wave components of a specific frequency generated from the high-frequency circuit in the apparatus and disposing the EBG structure member in the current path. That is, the arrangement disclosed in Japanese Patent Laid-Open No. 2011-18776 differs from an arrangement configured to reduce unnecessary radiation in an apparatus in association with the radiation gain of an antenna like a wireless communication apparatus.

As an anti-EMI measure for a wireless substrate mounted in a wireless communication apparatus, there is available a method of reducing unnecessary radiation components emitted from a high-frequency circuit and a circuit substrate GND mounted on a wireless substrate by electrically connecting the wireless substrate GND to a conductive member of the housing. However, since the circuit substrate GND operating as the GND of the antenna element and the conductive member, which are simultaneously mounted on the wireless substrate, are electrically connected to each other, the antenna element is high-frequency coupled to the conductive member, resulting in a decrease in radiation gain.

In Japanese Patent Laid-Open No. 2011-18776 to which an EBG structure is applied, unnecessary radiation is reduced by suppressing a resonant state in the housing. However, this technique cannot be applied to an anti-unnecessary-radiation measure associated with the antenna gain of a wireless communication apparatus including an antenna.

SUMMARY OF THE INVENTION

The present invention provides a structure which reduces harmonic noise without decreasing a radiation gain.

A structure member according to the present invention has the following arrangement. That is, a structure member mounted in a communication apparatus including a conductive housing incorporating a dielectric substrate on which a high-frequency circuit is mounted, the structure member comprising: a pass member which passes a harmonic current component of an operating frequency generated in the dielectric substrate when the high-frequency circuit operates; and a suppression member having an EBG structure which suppresses a predetermined current component of the operating frequency, wherein the structure member is provided between the dielectric substrate and the conductive housing, and the suppression member is disposed along a current path of a harmonic current component flowing in the pass member.

The present invention can provide a structure which reduces harmonic noise without decreasing a radiation gain.

Further features of the present invention will become apparent from the following description of exemplary embodiments (with reference to the attached drawings).

DESCRIPTION OF THE EMBODIMENTS

The embodiments of the present invention will be described in detail below with reference to the accompanying drawings.

First Embodiment

Figure 1:
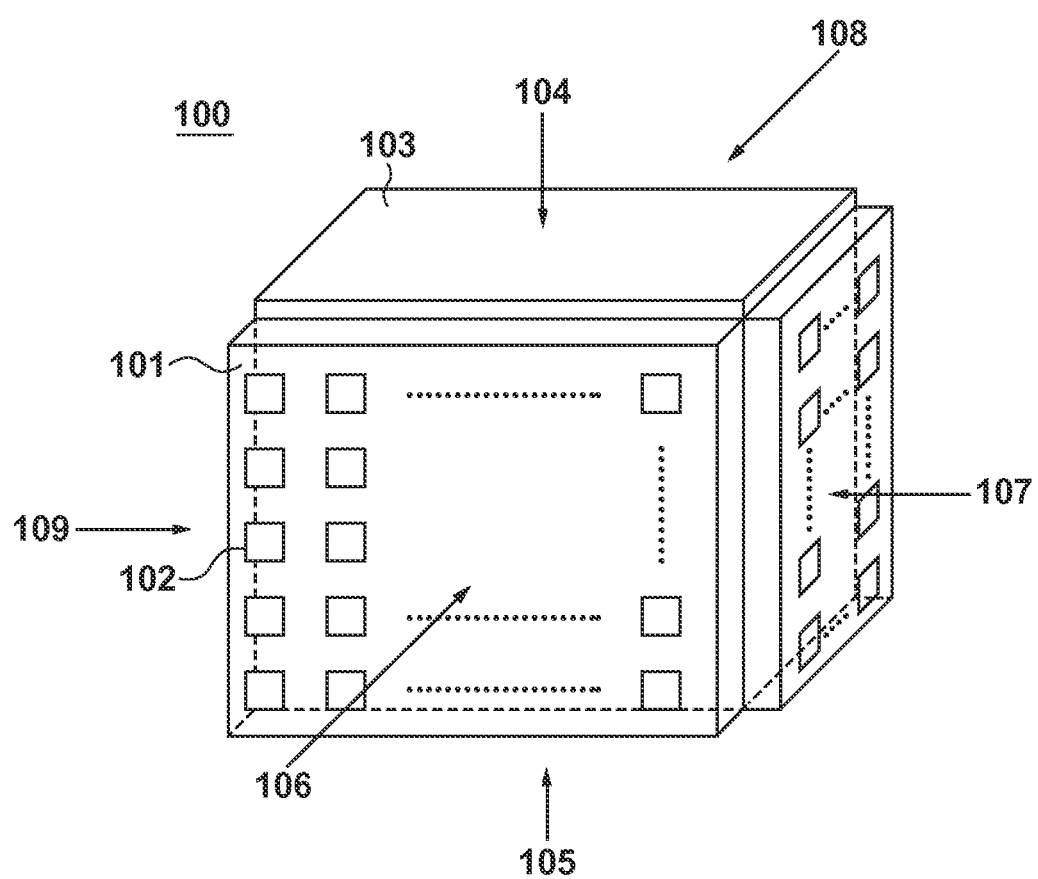
FIG. 1 is a perspective view showing the arrangement of a polyhedral EBG structure member according to the first embodiment.

FIG. 1 is a perspective view of a polyhedral EBG structure member according to the first embodiment of the present invention.

Reference numeral 100 denotes a polyhedral EBG structure member which is a feature of the present invention; 101, a dielectric base materials forming an EBG structure; 102, a square patch conductor formed on the surface of the dielectric base material 101; and 103, a conductive member having a polyhedral structure formed from a material having a sufficiently low impedance. In this case, a sufficiently low impedance indicates, for example, impedances (low impedances) whose average value is lower than a predetermined value.

The polyhedral EBG structure member 100 has the dielectric base materials 101, each forming an EBG structure, arranged on four side surfaces 106 to 109 except for an upper surface 104 and a bottom surface 105 of the conductive member 103 having a polyhedral structure. The dielectric base materials 101, each forming an EBG structure, arranged on the side surfaces 106 to 109 of the polyhedral EBG structure member 100 are identical dielectric base materials, which are high-frequency connected to each other by being bonded to the conductive member 103 having the polyhedral structure.

Figure 2:
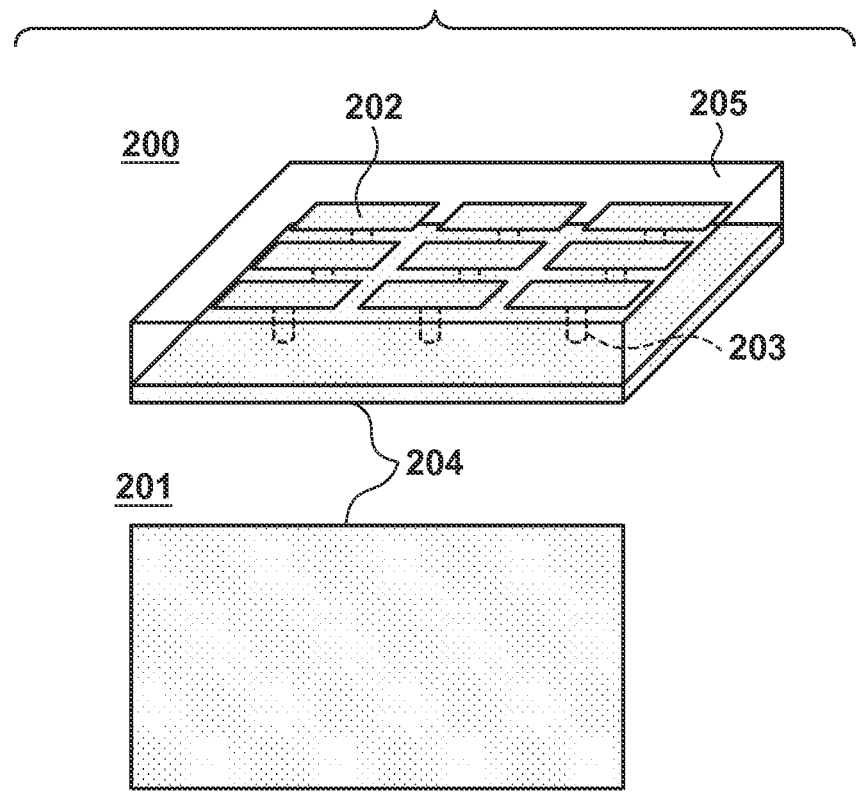
FIG. 2 is a view showing the arrangement of an EBG structure base material according to the first embodiment.

FIG. 2 shows an example of the EBG structure formed on the dielectric base material 101 to explain its operation. Referring to FIG. 2, reference numeral 200 denotes a perspective view of the EBG structure; and 201, a rear view of the structure.

The EBG structure includes patch conductors 202 as signal conductors, conduction vias 203 as conductive conductors conducting to the patch conductors 202, a ground conductor 204 on the rear surface, and a dielectric member (conductor) 205 as a capacitive member or a dielectric base material having a capacitive characteristic. The dielectric member 205 may be replaced with air. The conduction vias 203 extend through the dielectric member 205 and are configured to electrically connect the patch conductors 202 to the ground conductor 204 on the rear surface. As shown in FIG. 2, there are a plurality of patch conductors 202, for each of which the conduction via 203 is formed. In this case, the conduction via 203 is formed almost perpendicular to the signal conductor surface of the patch conductor 202 as a signal conductor.

A composite right/left-handed line CRLH is formed by a series capacitive reactance formed by the gap between the patch conductors 202, a series inducible reactance based on the length of the patch conductor 202, a parallel capacitive reactance formed by the gap between the patch conductor 202 and the ground conductor 204, and a parallel inducible reactance formed by the conduction via 203. As described above, the dielectric base material 101 includes a plurality of element arrays having an EBG structure.

Figure 3:
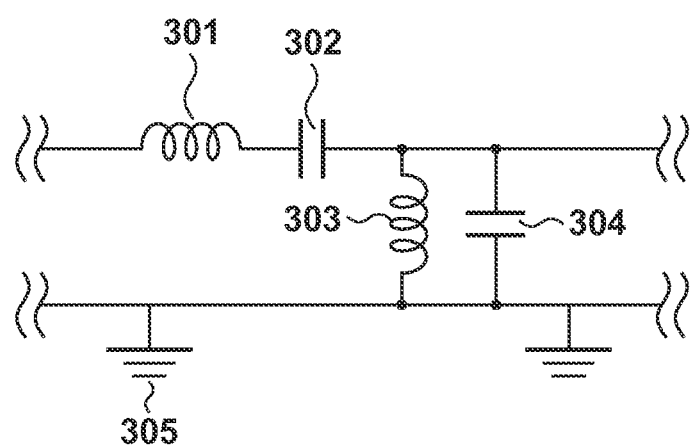
FIG. 3 is an equivalent circuit diagram of an EBG structure according to the first embodiment.

FIG. 3 shows an equivalent circuit 300 of a unit cell in FIG. 2. Since cells are arrayed two-dimensionally, an equivalent circuit should be two-dimensional. For the sake of simplicity, however, this circuit is expressed one-dimensionally. A series inducible reactance 301 indicates the patch conductor 202, and a series capacitive reactance 302 indicates the gap between the adjacent patch conductors 202. A parallel inducible reactance 303 indicates the conduction via 203 which electrically connects the patch conductor 202 to the ground conductor 204, and a capacitive reactance 304 connected in parallel between a signal line and a ground 305 indicates the gap between the patch conductor 202 and the ground conductor 204. The ground 305 in the equivalent circuit 300 indicates the ground conductor 204.

The frequency band between the resonance frequency of a series element and the resonance frequency of a parallel element is a band (EBG: Electromagnetic Band Gap) in which the phase constant is 0 and through which no electromagnetic waves are transmitted. Parameters are designed to adjust the series resonance frequency and the parallel resonance frequency so as to obtain a desired (specific) frequency band. The EBG structure 200 shown in FIG. 2 is constituted by the patch conductors 202, the conduction vias 203, and the ground conductor 204, and is configured to shield against electromagnetic waves in the desired frequency band by designing parameters such a patch interval, via diameter, and via length.

Figure 4:
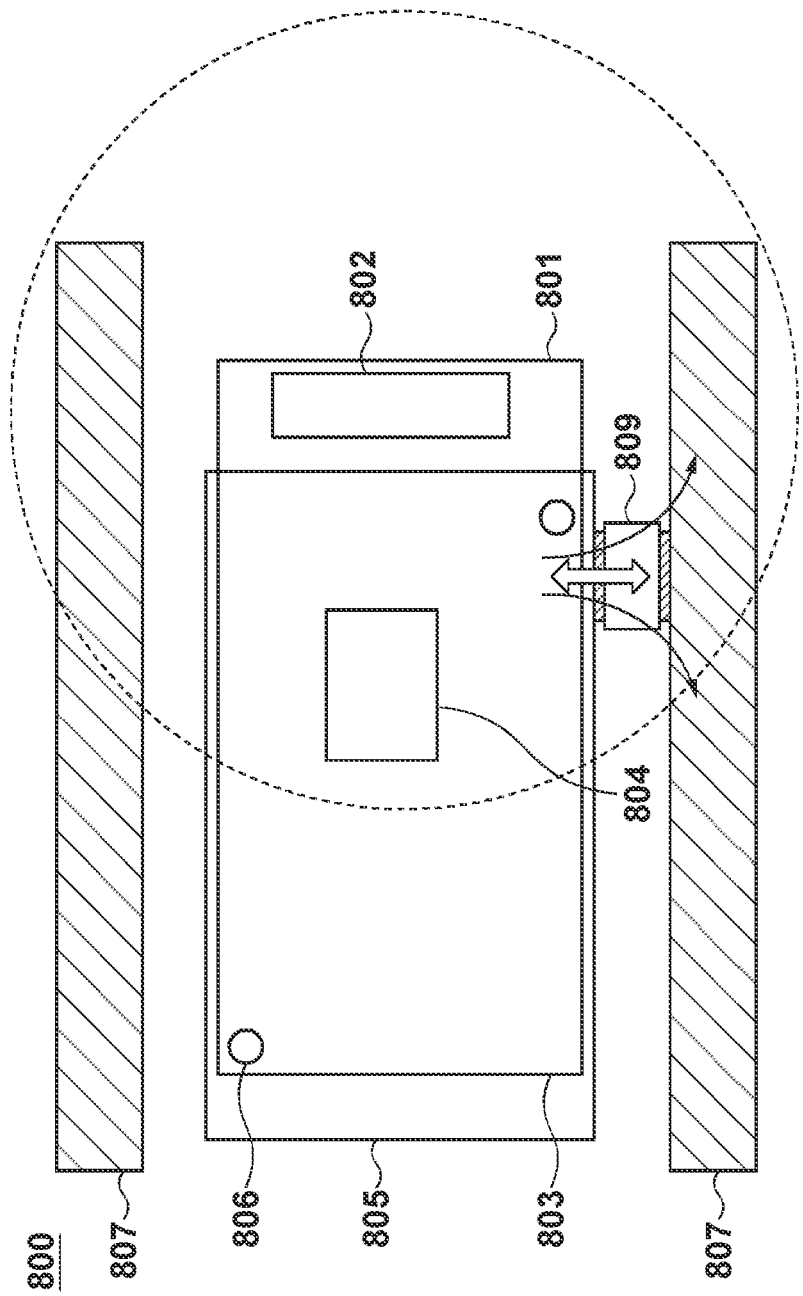
FIG. 4 is a view showing an application of the polyhedral EBG structure member according to the first embodiment.

FIG. 4 shows an example of reducing unnecessary radiation by applying the polyhedral EBG structure member of the present invention to a wireless communication apparatus.

Figure 10:
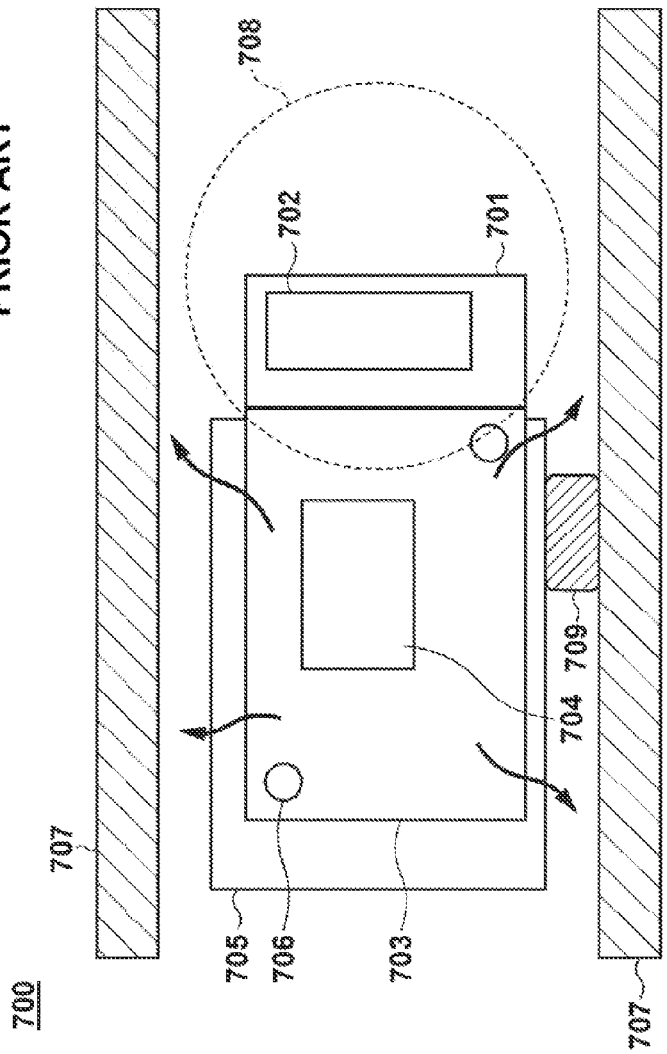
FIG. 10 is a view for explaining the relationship between an antenna gain and a conventional wireless communication apparatus after execution of the anti-unnecessary-radiation measure.

Reference numerals 800 to 807 in FIG. 4 denote the same members as those denoted by reference numerals 700 to 707 in FIG. 10, and hence a detailed description of them will be omitted.

Reference numeral 809 denotes a polyhedral EBG structure member (corresponding to the polyhedral EBG structure member 100 in FIG. 1) which is a feature of the present invention. The polyhedral EBG structure member 809 is disposed between the conductive attachment plate 805 and the conductive cover 807 which is the conductive housing of the wireless communication apparatus. This electrically connects the upper surface 104 of the conductive member 103 having the polyhedral structure shown in FIG. 1 to the conductive attachment plate 805 shown in FIG. 8, and also electrically connects the bottom surface 105 of the conductive member 103 having the polyhedral structure shown in FIG. 1 to the conductive cover 807 shown in FIG. 8.

As described above, the wireless communication apparatus 800 includes the dielectric substrate 801 on which the antenna (antenna element) 802 and the high-frequency unit 804 as a high-frequency circuit are mounted and the conductive housing incorporating the dielectric substrate 801.

As has been described above, according to the first embodiment, the polyhedral EBG structure member 809 electrically connects the conductive attachment plate 805 to the conductive cover 807. This forms a current path along which the current components of electromagnetic waves contributing to unnecessary radiation excited by the GND portion 803 of the dielectric substrate 801 flow to the conductive cover 807 forming the wireless communication apparatus 800.

That is, at the time of operation of the high-frequency unit 804, the current components of electromagnetic waves contributing to the unnecessary radiation excited by the GND portion 803 of the dielectric substrate 801 partially flow to the conductive cover 807. That is, the harmonic current components of the operating fundamental frequency of the wireless communication apparatus 800 flow on the overall surface of the conductive cover 807 and are consumed. This reduces the amount of current components of unnecessary radiation emitted from the wireless communication apparatus 800.

The polyhedral EBG structure member 809 high-frequency connects the conductive attachment plate 805 to the conductive cover 807. This makes the harmonic current components of the operating fundamental frequency of the wireless communication apparatus flow from the GND portion 803 of the antenna-mounted substrate to a conductive member of the housing via the conductive member 103 of the polyhedral EBG structure member 809. This reduces the harmonic current components. That is, the conductive member 103 functions as a harmonic pass member which passes harmonic current components.

In addition, the dielectric base material 101 having the EBG structure of the polyhedral EBG structure member 809 suppresses the current components of the fundamental wave current components of the operating fundamental frequency. That is, the dielectric base material 101 functions as a fundamental wave suppression member which suppresses fundamental wave current components of the operating fundamental frequency.

The dielectric base material 101 as a fundamental wave suppression member is disposed parallel to the current path of harmonic current components flowing in the conductive member 103 as a harmonic pass member.

This suppresses coupling between the GND portion 803 of the antenna-mounted substrate and the conductive cover 807 of the housing, thereby suppressing a decrease in the radiation gain of the antenna-mounted substrate.

Second Embodiment

FIG. 2 shows an example of the EBG structure formed on the dielectric base material 101 in the first embodiment. However, an EBG structure may be formed on a thin film instead of a dielectric base material by using conductive patches of the surface layer pattern type.

Figure 5:
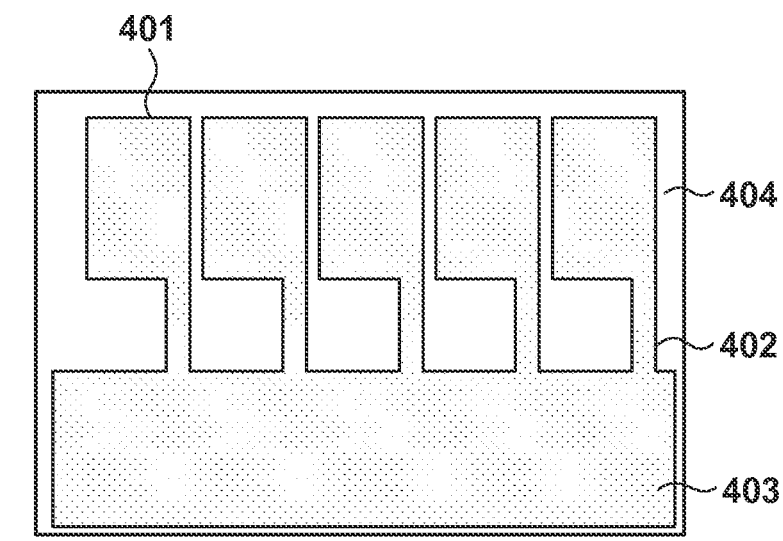
FIG. 5 is a view showing the arrangement of an EBG structure base material according to the second embodiment.

FIG. 5 shows an EBG arrangement 400 of the surface layer pattern type.

Referring to FIG. 5, this arrangement includes patch conductors 401, conductive conductors 402, a ground conductor 403, and a dielectric portion 404. As in the arrangement shown in FIG. 2, the conductive conductors 402 electrically connect the patch conductors 401 to the ground conductor 403. The equivalent circuit of FIG. 5 is the same as that of FIG. 3. As described above, the patch conductors 401, the conductive conductors 402, the ground conductor 403, and the dielectric portion 404 are arranged within the same plane.

The series inducible reactance 301 indicates the patch conductor 401, and the series capacitive reactance 302 indicates the gap between the adjacent patch conductors 401. The parallel inducible reactance 303 indicates the conductive conductor 402, and parallel capacitive reactance indicates the gap between the patch conductor 401 and the ground conductor 403. The ground 305 in the equivalent circuit 300 indicates the ground conductor 403.

It is possible to obtain a desired electromagnetic wave cutoff band by changing a series resonance frequency and a parallel resonance frequency by changing parameters such as the size and shape of the patch conductor 401, the gap between the patch conductors 401, the interval between the patch conductor 401 and the ground conductor 403, and the size and shape of the conductive conductor 402.

Figure 6:
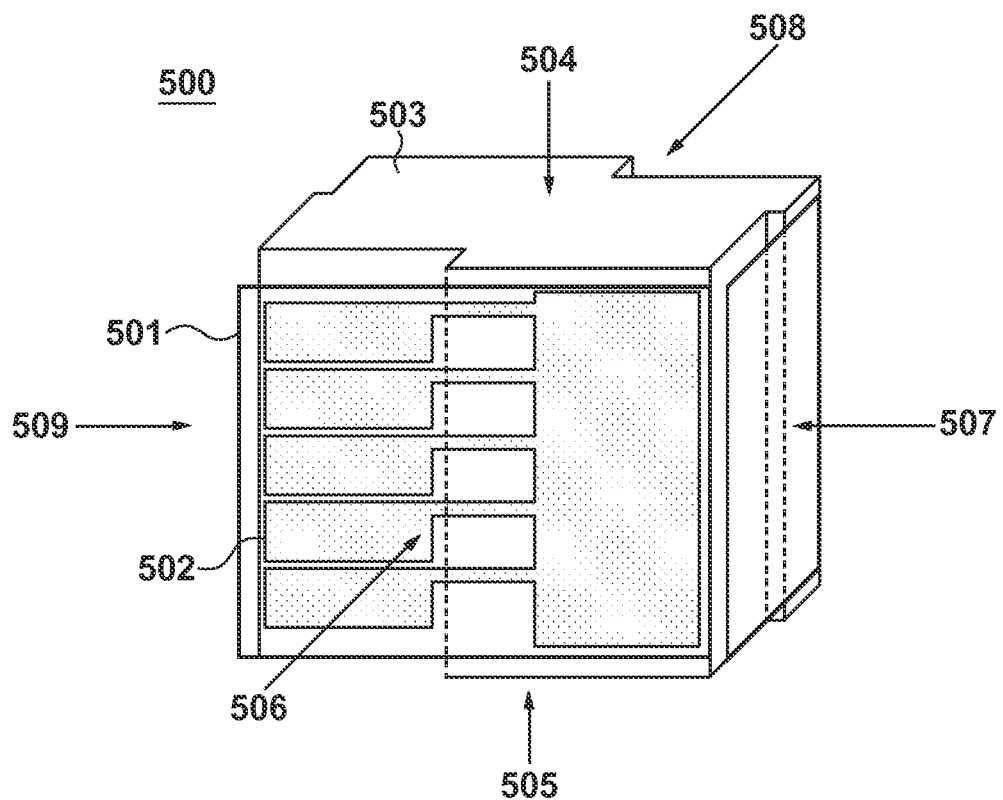
FIG. 6 is a perspective view showing the arrangement of a polyhedral EBG structure member according to the second embodiment.

FIG. 6 shows the arrangement of a polyhedral EBG structure member using an EBG arrangement of the surface layer pattern type.

Referring to FIG. 6, reference numeral 500 denotes a polyhedral EBG structure member which is a feature of the present invention in the second embodiment.

Referring to FIG. 6, reference numeral 501 denotes a dielectric base material which forms an EBG structure by using a conductive pattern such as a thin film; 502, a square patch conductor formed on the surface of the dielectric base material 501; and 503, a conductive member having a polyhedral structure formed from a conductive material having a sufficiently low impedance.

The polyhedral EBG structure member 500 has the dielectric base materials 501, each forming an EBG structure, arranged on four side surfaces 506 to 509 except for an upper surface 504 and a bottom surface 505 of the conductive member 503 having a polyhedral structure. The dielectric base materials 501 forming the EBG structure arranged on the side surfaces 506 to 509 of the polyhedral EBG structure member 500 are identical dielectric base materials, which are high-frequency connected to each other by being bonded to the conductive member 503 having the polyhedral structure.

As described above, according to the second embodiment, in addition to the effects described in the first embodiment, it is possible to improve the degree of freedom in designing the shape of an EBG structure and suppress an increase in size by forming an EBG structure on a thin film using conductive patches of the surface layer pattern type.

Modification

Figure 7:
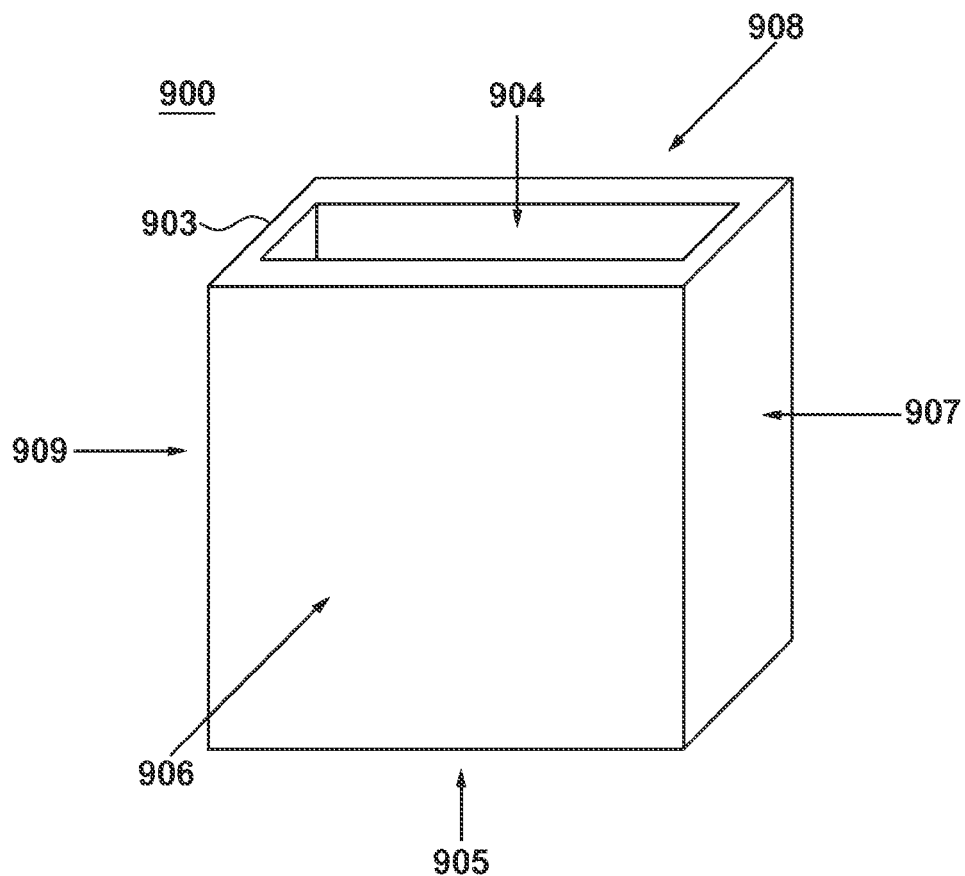
FIG. 7 is a perspective view showing a modification of the polyhedral EBG structure member according to the first embodiment.
Figure 8:
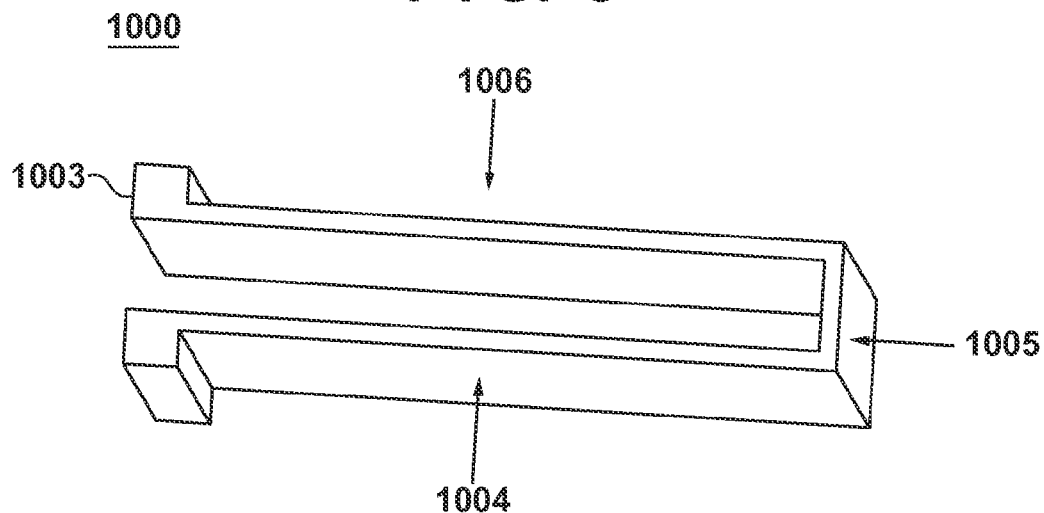
FIG. 8 is a perspective view showing a modification of the polyhedral EBG structure member according to the second embodiment.
Figure 9:
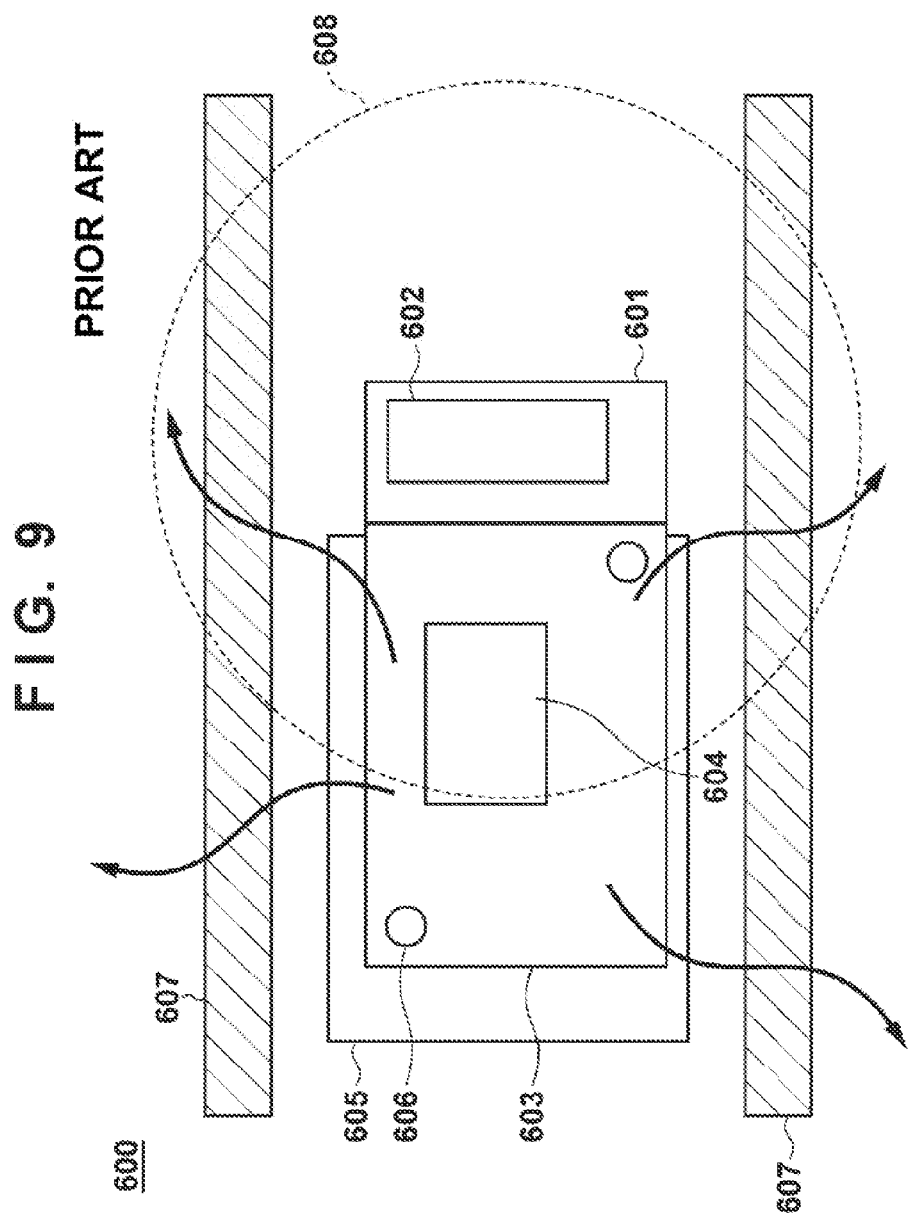
FIG. 9 is a view for explaining the relationship between an antenna gain and a conventional wireless communication apparatus before execution of an anti-unnecessary-radiation-measure.

FIGS. 7 and 8 each show a modification of a polyhedral conductive member according to the present invention.

FIG. 7 shows a modification of the conductive member 103 having the polyhedral structure shown in FIG. 1. The upper surface 104 and the bottom surface 105 of the conductive member 103 are provided with hollows. Referring to FIG. 7, an upper surface 904 and a bottom surface 905 are hollows.

A polyhedral EBG structure member 900 has the dielectric base materials 101, each forming the EBG structure shown in FIG. 1, arranged on four side surfaces 906 to 909 except for the upper surface 904 and the bottom surface 905 of the conductive member 903 having a polyhedral structure. The dielectric base materials, each forming the EBG structure, arranged on the side surfaces 906 to 909 of the polyhedral EBG structure member 900 are dielectric base materials 101 identical to those in FIG. 1, which are high-frequency connected to each other by being bonded to the conductive member 903 having the polyhedral structure.

FIG. 8 shows a modification of the conductive member 503 having the polyhedral structure shown in FIG. 6, which is obtained by deforming the conductive member 503 having the polyhedral structure into a U shape. Referring to FIG. 8, a polyhedral EBG structure member 1000 has dielectric base materials 501, each forming an EBG structure shown in FIG. 6, arranged on three surfaces of a conductive member 1003 having a polyhedral structure in FIG. 8, i.e., a front surface 1004, a side surface 1005, and a rear surface 1006.

The dielectric base materials, each forming the EBG structure, arranged on the surfaces 1004 to 1006 of the polyhedral EBG structure member 1000 are the dielectric base materials 501 identical to that shown in FIG. 6, which are high-frequency connected to each other by, for example, being bonded to the conductive member 1003 having the polyhedral structure shown in FIG. 8.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-113759, filed on May 17, 2012 which is hereby incorporated by reference herein in its entirety.

What is claimed is:

1. A structure member mounted in a communication apparatus including a conductive housing incorporating a dielectric substrate on which a high-frequency circuit is mounted, the structure member comprising:
   a pass member which passes a harmonic current component of an operating frequency generated in said dielectric substrate when the high-frequency circuit operates; and
   a suppression member having an EBG structure which suppresses a predetermined current component of the operating frequency,
   wherein the structure member is provided between said dielectric substrate and said conductive housing, and
   said suppression member is disposed along a current path of said harmonic current component flowing in said pass member.

2. The structure member according to claim 1, wherein the structure member is provided between a GND portion of said dielectric substrate and said conductive housing.

3. The structure member according to claim 1, wherein said pass member passes said harmonic current component of said operating frequency generated in a GND portion of said dielectric substrate when the high-frequency circuit operates.

4. The structure member according to claim 1, wherein said pass member has a polyhedral structure.

5. The structure member according to claim 1, wherein said suppression member suppresses a fundamental wave current component of said operating frequency generated in a GND portion of said dielectric substrate when the high-frequency circuit operates.

6. The structure member according to claim 1, wherein said suppression member is disposed parallel to said current path.

7. The structure member according to claim 1, wherein said pass member includes a low-impedance conductive member and has a plurality of flat surfaces.

8. The structure member according to claim 1, wherein said pass member has a plurality of flat surfaces along the current path.

9. The structure member according to claim 1, wherein said suppression member includes a dielectric base material on which a plurality of element arrays, each having said EBG structure, are arranged.

10. The structure member according to claim 9, wherein said suppression member is disposed on at least one of a plurality of flat surfaces of said pass member.

11. The structure member according to claim 1, wherein said suppression member includes a plurality of signal conductors, a plurality of conductive conductors conducting to said signal conductors, and a dielectric base material.

12. The structure member according to claim 11, wherein at least one of the conductive conductors is disposed substantially perpendicular to a signal conductor surface of said signal conductor.

13. The structure member according to claim 11, wherein said signal conductor and said conductive conductor are formed within the same plane.

14. The structure member according to claim 1, wherein an antenna element is disposed on said dielectric substrate.

15. A communication apparatus comprising:
   a conductive housing incorporating a dielectric substrate on which a high-frequency circuit is mounted; and
   a structure member,
   said structure member comprising
   a pass member which passes a harmonic current component of an operating frequency generated in said dielectric substrate when the high-frequency circuit operates; and a suppression member having an EBG structure which suppresses a predetermined current component of the operating frequency, wherein the structure member is provided between said dielectric substrate and said conductive housing, and said suppression member is disposed along a current path of said harmonic current component flowing in said pass member.

16. The apparatus according to claim 15, wherein the structure member is provided between a GND portion of said dielectric substrate and said conductive housing.

17. The apparatus according to claim 15, wherein said pass member passes said harmonic current component of said operating frequency generated in a GND portion of said dielectric substrate when the high-frequency circuit operates.

18. The apparatus according to claim 15, wherein said pass member has a polyhedral structure.

19. The apparatus according to claim 15, wherein said suppression member suppresses a fundamental wave current component of said operating frequency generated in a GND portion of said dielectric substrate when the high-frequency circuit operates.

20. The apparatus according to claim 15, wherein said suppression member is disposed parallel to said current path.

21. The apparatus according to claim 15, wherein said pass member includes a low-impedance conductive member and has a plurality of flat surfaces.

22. The apparatus according to claim 15, wherein said pass member has a plurality of flat surfaces along the current path.

23. The apparatus according to claim 15, wherein said suppression member includes a dielectric base material on which a plurality of element arrays, each having said EBG structure, are arranged.

24. The apparatus according to claim 23, wherein said suppression member is disposed on at least one of a plurality of flat surfaces of said pass member.

25. The apparatus according to claim 15, wherein said suppression member includes a plurality of signal conductors, a plurality of conductive conductors conducting to said signal conductors, and a dielectric base material.

26. The apparatus according to claim 25, wherein at least one of the conductive conductors is disposed substantially perpendicular to a signal conductor surface of said signal conductor.

27. The apparatus according to claim 25, wherein said signal conductor and said conductive conductor are formed within the same plane.

28. The apparatus according to claim 15, wherein an antenna element is disposed on said dielectric substrate.

* * * * *